United States Patent
Kleijnen et al.

(10) Patent No.: US 11,049,849 B2
(45) Date of Patent: Jun. 29, 2021

(54) ARRANGEMENT OF LEDS ON A LEADFRAME

(71) Applicant: Lumileds LLC, San Jose, CA (US)

(72) Inventors: Christian Kleijnen, Ell (NL); Floris Maria Hermansz Crompvoets, Bunde (NL); Ralph Hubert Peters, Kerkrade (NL); Maurice Kuijpers, Vlissingen (NL); Rob Bastiaan Maria Einig, Aldenhoven (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/468,250

(22) PCT Filed: Dec. 6, 2017

(86) PCT No.: PCT/EP2017/081729
§ 371 (c)(1),
(2) Date: Jun. 10, 2019

(87) PCT Pub. No.: WO2018/108676
PCT Pub. Date: Jun. 21, 2018

(65) Prior Publication Data
US 2020/0075557 A1 Mar. 5, 2020

(30) Foreign Application Priority Data
Dec. 13, 2016 (EP) .................................... 16203796

(51) Int. Cl.
*H01L 25/075* (2006.01)
*H01L 33/62* (2010.01)
(Continued)

(52) U.S. Cl.
CPC .......... *H01L 25/0753* (2013.01); *H01L 33/62* (2013.01); *F21V 23/06* (2013.01); *H01L 33/60* (2013.01); *H01L 2933/0066* (2013.01)

(58) Field of Classification Search
CPC ................. H01L 25/0753; H01L 33/62; H01L 2933/0066; H01L 33/60; F21Y 2103/10; F21V 23/06; F21S 2/005
(Continued)

(56) References Cited

U.S. PATENT DOCUMENTS

| 5,084,804 A | 1/1992 | Schairer |
| 8,530,250 B2 | 9/2013 | Ichikawa et al. |

(Continued)

FOREIGN PATENT DOCUMENTS

| CN | 101294694 A | 10/2008 |
| EP | 2827045 A1 | 1/2015 |

(Continued)

OTHER PUBLICATIONS

US 8,807,786 B2, 08/2014, Moon et al. (withdrawn)
(Continued)

*Primary Examiner* — Thinh T Nguyen
(74) *Attorney, Agent, or Firm* — Volpe Koenig

(57) ABSTRACT

A lighting device includes LED lighting elements arranged at a distance from each other. A leadframe comprising conductor segments interconnecting the LED lighting elements. The LED lighting elements each comprise an LED die element attached to one of the conductor segments of the leadframe. The LED lighting elements further each comprise a holding element disposed to hold at least two of the conductor segments of the leadframe which are partially embedded within one of the holding elements. In order to obtain good optical properties, the holding elements do not cover the LED die elements. According to the proposed manufacturing method, conductor segments of the leadframe are provided and holding elements are formed at a distance from each other, each partially embedding at least two conductor segments. Mounting portions on the conduc-
(Continued)

tor segments are not covered by the holding elements. LED die elements are attached to the mounting portions.

9 Claims, 4 Drawing Sheets

(51) Int. Cl.
    *F21V 23/06*     (2006.01)
    *H01L 33/60*     (2010.01)

(58) Field of Classification Search
    USPC .................. 257/88, 666; 438/22, 24, 46, 47
    See application file for complete search history.

(56) References Cited

U.S. PATENT DOCUMENTS

| | | |
|---|---|---|
| 9,997,684 B2 | 6/2018 | Bierhuizen et al. |
| 10,038,122 B2 | 7/2018 | Martin |
| 2005/0239342 A1* | 10/2005 | Moriyama et al. .... H05K 3/202 439/699.2 |
| 2008/0239716 A1 | 10/2008 | Lin |

FOREIGN PATENT DOCUMENTS

| | | |
|---|---|---|
| WO | 2014/207620 A1 | 12/2014 |
| WO | 2015/180978 A1 | 12/2015 |

OTHER PUBLICATIONS

European Search Report dated May 23, 2017 for the European Patent Application No. 16203796.4.
International Preliminary Report on Patentability dated Jun. 18, 2019 for PCT International Application No. PCT/EP2017/081729.
International Search Report and Written Opinion dated Mar. 1, 2018 for PCT International Application No. PCT/EP2017/081729.

* cited by examiner

ARRANGEMENT OF LEDS ON A LEADFRAME

FIELD OF THE INVENTION

The invention relates to a lighting device and to a method of manufacturing a lighting device. More particularly, the invention relates to a lighting device with a plurality of LED light sources mounted on a leadframe.

BACKGROUND OF THE INVENTION

LED light sources comprise an LED chip, which is here referred to as an LED die, as the actual light emitting component. For semiconductor LEDs, the die generally is a chip of doped semiconducting material which includes a p/n junction.

For use in lighting and signaling applications, electrical contacts are connected to the LED die element. While the pure LED die elements may be referred to as L0 LEDs, one or more LED die elements with electrical conductors attached thereto and fixed in a housing are referred to as L1 LEDs.

EP 2 827 045 A1 discloses an electrode module of a non-conductive frame with integral electrode patterns providing power to a LED device. The LED device is accommodated in a mounting hole of the non-conductive frame. The electrode pattern has unit bodies formed repeatedly, the unit bodies are interposed between first and second parallel lines.

SUMMARY OF THE INVENTION

It may be considered an object to provide a lighting device with multiple spaced apart light sources which is easy to manufacture and provides good operating properties.

The present inventors have considered a lighting device with spaced apart LED light sources on a leadframe. In the present context, a leadframe is understood as referring to conductor structures, preferably made of a metal such as e. g. copper or copper alloy. A leadframe comprises a plurality of (i. e. at least two, usually more than two) conductor segments, which in the finished product are separate from each other. Preferably, the conductor segments are each flat elements e. g. produced by removing material, for example by stamping, from a flat sheet or plate. Contrary to a printed circuit board, the conductor segments may be separate, self-supporting elements which do not necessitate a substrate.

In the lighting device considered by the inventors, LED light sources may be arranged in spaced apart locations interconnected by conductor segments of a leadframe. The inventors have considered that using packaged LED elements, i. e. L1 die elements, may have several disadvantages. Due to the LED packaging, the thermal contact between the LED die element and the leadframe may be impaired. Additionally, the increased size of the packaged LED elements may reduce flexibility in the design of desired optical functionality. In particular in mass production, use of L1 packaged LED elements may lead to higher costs.

On the other hand, directly attaching unpackaged (L0) LED die elements to conductor segments of a leadframe may involve a complex and risky production process, in particular if the conductor segments of the leadframe are not fixed relative to each other. While this may be addressed by embedding the LED die and adjacent conductor segments, these measures may impair optical functionality.

To avoid such disadvantages, the inventors have proposed the lighting device and manufacturing method according to the invention.

The lighting device includes a plurality, i. e. at least two LED lighting elements arranged at a distance from each other. Each LED lighting element constitutes a separate light source and includes at least one, possibly multiple LED die elements. In the lighting device, the lighting elements may be distributed according to any desired arrangement, such as e. g. in a 2D or 3D arrangement. Preferably, the LED lighting elements may be arranged in a common plane or in a line. The distances between the LED lighting elements may vary according to the desired application. For example, distances between the first and second LED lighting elements (and also between further LED lighting elements of the lighting device) may be as small as 1 mm or more or as large as 10 cm or less. Particularly preferred may be distances of 3-50 mm, especially 5-20 mm between the LED lighting elements. In advantageous embodiments, the distance between LED lighting elements may e.g. be at least as large as the size of the LED lighting elements (measured in parallel to the distance), preferably at least twice the size thereof.

The lighting device includes a leadframe with a plurality of conductor segments extending between the LED lighting elements. Two adjacent LED lighting elements may e.g. be interconnected by at least one, preferably by at least two conductor segments extending between the LED lighting elements.

The LED lighting elements each comprise at least one LED die element attached to conductor segments of the leadframe. The LED die elements are directly attached to the conductor segments, which may be referred to a mounting conductor segments.

The LED lighting elements further each comprise a holding element disposed to hold at least two conductor segments of the leadframe. The holding element is arranged such that at least two conductor segments are partially embedded therein, thus fixing the conductor segments in position relative to each other. The holding element thus adds stability and stiffness to the leadframe.

According to the invention, the holding elements however do not cover the LED die elements.

According to the manufacturing method of the invention, the holding elements are formed at a distance from each other on the leadframe, each embedding at least two conductor segments. At least one of the conductor segments comprises a mounting portion which is not covered by the holding elements. The LED die elements are attached to these mounting portions.

The inventive method and device have several advantages. Generally, use of a leadframe for the interconnection of LED light sources allows a very flexible design, low-cost manufacturing and reduced size. Directly attaching LED die elements i. e. unpackaged L0 LED dies to conductor segments of a leadframe provides good thermal contact. A thermal barrier due to packaging of the LED die element is avoided and heat generated in operation of the LEDs may be dissipated by conduction through the leadframe. By providing holding elements for holding conductor segments by embedding, the conductor segments of the leadframe are stabilized, such that a stable device is obtained which can be handled, transported or integrated into other products. Preferably, all conductor segments of the leadframe are fixed by the holding elements, such that no loose elements remain. For example, one of the conductor segments embedded in the holding element of one LED lighting element may extend from the LED lighting element into a first direction and another one of the embedded conductor elements may extend into a second, opposite direction. This is particularly advantageous to form a chain of interconnected LED lighting elements, e.g. arranged in a line.

The manufacturing method is relatively easy and can provide a high yield. Failure detection is possible directly after attachment of the LED die elements, i. e. at an early stage.

While in principal the step of attaching the LED die elements to conductor segments of the leadframe may be done before forming the holding elements, it is preferred to form the holding elements prior to attaching the LED die elements, not covering the mounting areas for later installation of the LED die elements. The stabilized leadframe allows to easily attach the LED die elements. In particular electrically contacting of LED die elements to further conductor segments, such as e. g. by a wire connection, particularly preferred a bond wire, is significantly facilitated by fixing the conductor segments through the holding elements.

Since the LED die elements are not covered by the holding elements, disadvantageous optical influences of the holding elements may be avoided, and full flexibility for optical design may be retained.

According to one embodiment, the LED die elements may be positioned within cutouts of the holding elements. For example, the holding elements may partially surround the LED die elements, leaving free mounting portions for the LED die elements. Each of the holding elements may be arranged at a distance from the respective LED die element. For example, the holding element may be shaped to fully or partially surround the LED die element in a plane parallel to the conductor segment on which it is mounted. In this plane, the holder may partially or fully encircle the LED die element.

Preferably, the holding elements may be arranged to partially surround the LED die elements at a distance, while leaving at least one opening through which light may be emitted. The LED die elements may comprise a top surface disposed to emit light. The opening is preferably arranged such that directions perpendicular to the top surface of the LED die element are not covered. For example, the holding element may be shaped and arranged relative to the LED die element such that light emitted therefrom under elevation angles relative to the top surface of more than 45°, preferably more than 25°, particularly 15° or more is freely emitted. The opening formed in the holding element may have any shape, such as e. g. circular, elliptical or drop shaped.

The holding elements may preferably be made of any material that is not electrically conductive. Preferred are plastic materials, which may e. g. be applied by a molding process, such as e. g. injection molding. Holding elements may be of flat shape, e. g. with a top surface and opposed bottom surface parallel to the leadframe. The material of the holding elements may be optically transparent for the light emitted by the LED die element, but is preferred to use an opaque material to avoid stray light. In particular, it may be preferred to use opaque material of high, yet non-specular reflectivity, such as e.g. of white color.

While the holding elements may be provided only for holding the conductor segments of the leadframe, it is also possible to provide one, some or all of the holding elements with further functions. For example, at least some of the holding elements may comprise a mechanical and/or electrical connector element. A mechanical connector element provided on the bottom portion of the holding element, i. e. opposed to the LED die, may e.g. be used for positioning the lighting device. A mechanical connector provided on the opposite top side may e.g. provide a mechanical connection to an optical element, such as e.g. a lens, reflector, collimator, etc. In a preferred embodiment, an electrical connector may be provided by a bent portion of at least one leadframe conductor portion surrounded by a connector housing formed integrally with a holding element.

In some embodiments, a bottom electrical terminal of the LED die elements may be in direct contact with a mounting portion on a conductor segment of the leadframe. An opposed top electrical terminal may be electrically connected to a contacting portion on a separate conductor segment, which may be referred to as a contacting conductor segment, e. g. by a wire, in particular a bond wire. Preferably, the LED die elements are provided as flat die pads with opposed parallel top and bottom surfaces. In particular if a wire connection is formed, the holder elements are preferably arranged to partially embed the conductor segments to which the LED die element is connected. The conductor segment comprising the mounting portion may be separated from the conductor segment comprising the contacting portion by a gap. Both portions may be arranged within a cutout or opening of a holding element.

While the above description makes reference only to the first and second LED lighting elements, the skilled person will understand that this only refers to the basic concept, while in most practical applications a larger number of LED lighting elements and interconnecting conductor segments will be present. For example, the lighting device may include three, four or more, e. g., more than 5, more than 10 or more than 20 LED lighting elements.

According to one embodiment, at least a third LED lighting element may be provided in addition to the first and second LED lighting elements. All LED lighting elements may be arranged at a distance from each other and interconnected by conductor segments of the leadframe. All LED lighting elements comprise at least one LED die element and at least one holding element.

In one example case of three LED lighting elements, the first and second LED lighting elements are interconnected by first and second conductor segments of the leadframe. A further conductor segment, which for reference will be referred to as a third conductor segment, may extend between the second LED lighting element and the third LED lighting element. It is then preferred that the LED die of the first LED lighting element is attached to the first conductor element, and the LED die element of the second LED lighting element is attached to the third conductor segment of the leadframe.

In particular, the LED die element of the second LED lighting element may be electrically connected between the first conductor segment and the third conductor segment, which preferably extend to opposite sides thereof.

By providing an appropriate shape of the conductor segments of the leadframe, a desired electrical circuit comprising the LED die elements may be provided. For example, LED die elements may be electrically connected in parallel, in series, or in a series/parallel configuration.

In one embodiment, the LED die elements of two, three or more LED lighting elements, may be electrically arranged in series. As a preferred structure, a chain of conductor segments may be provided where on each conductor segment of the chain at least one LED die element is mounted, and this LED die element is electrically connected by a wire to the next conductor segment of the chain. In particular, successive conductor segments in the chain may be jointly embedded within the same holding element.

In one embodiment, two, three or more LED die elements may be interconnected by conductor segments of the leadframe to be arranged electrically connected in series, while a plurality of such series circuits is electrically connected in parallel.

While it is possible to cover portions of the lighting device, in particular the conductor segments extending between the LED lighting elements, it is preferred to provide the conductor segments freely extending between the LED lighting elements, i. e. preferably not embedded in a further structure, such that bending and shaping of the lighting device is possible. In particular, LED lighting elements arranged in a chain may be bent to follow a desired curved contour.

In one embodiment, at least one of the conductor segments extending between the LED lighting elements comprises at least one bent portion, i. e. does not extend entirely straight. Further preferred, at least one conductor segment may comprise opposite bent portions, i. e. a first portion bent in a first bending direction and a second portion bent in a second, opposite bending direction. The first and second conductor segments extending between the first and second LED lighting elements may be shaped differently, e. g. such that one conductor segment has a larger length than the other conductor segment, e. g. because of a bend, loop or other shape. By providing bends, loops, and/or different lengths of the conductor segment, the lighting device is more easily deformable; i. e. individual portions may be bent relative to each other, e. g. to follow a desired contour.

According to one embodiment, one conductor segment may extend as a central conductor segment between at least two LED lighting elements, arranged in between first and second side conductor segments. In preferred embodiments, the central conductor segment may extend at least substantially straight, whereas the side conductor segments may comprise bent portions. Particularly preferably, the arrangement may be symmetrical, i. e. the bent shapes of the side conductor segments may be symmetrical to a central axis through the central conductor segment.

These and other aspects of the invention will be apparent from and elucidated with reference to the embodiments described hereinafter.

DETAILED DESCRIPTION OF EMBODIMENTS

Figure 1:
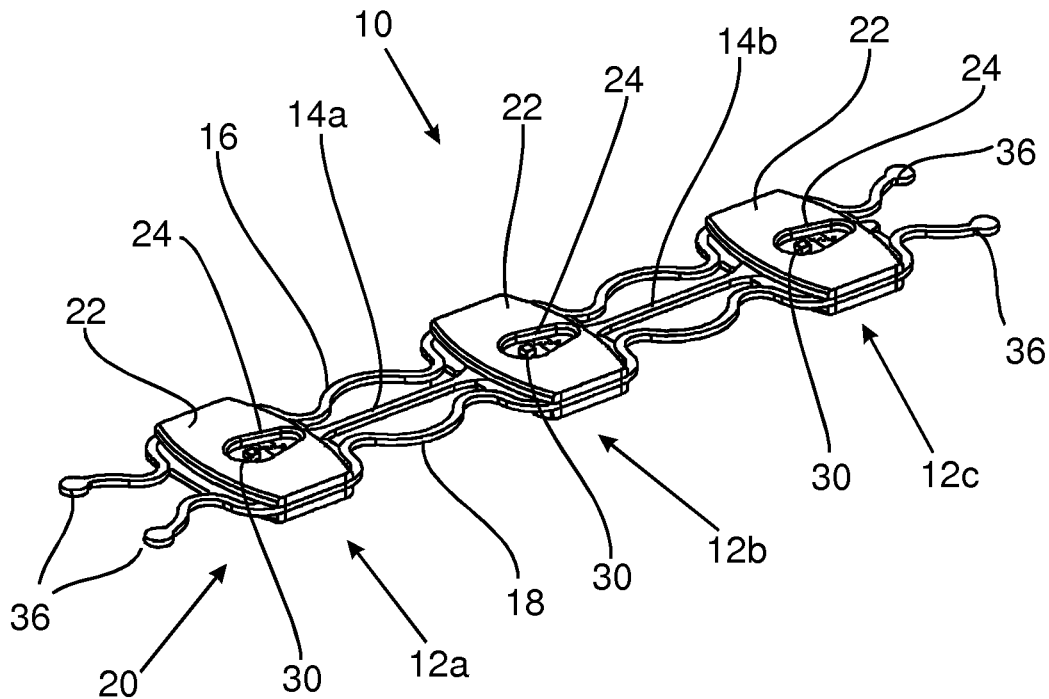
FIG. 1 shows a perspective view of an embodiment of a lighting device.

A first embodiment of a lighting device 10 is shown in FIG. 1, comprising three separate LEDs 12a, 12b, 12c arranged in a line, interconnected by conductor segments 14a, 14b, 16, 18 of a leadframe 20.

The three LEDs 12a, 12b, 12c have identical outer shape. Each comprises a holder 22 with a cutout 24. The LEDs 12a, 12b, 12c in the example shown are provided spaced by a distance about twice their size (measured along the length of the lighting device 10).

Figure 2:
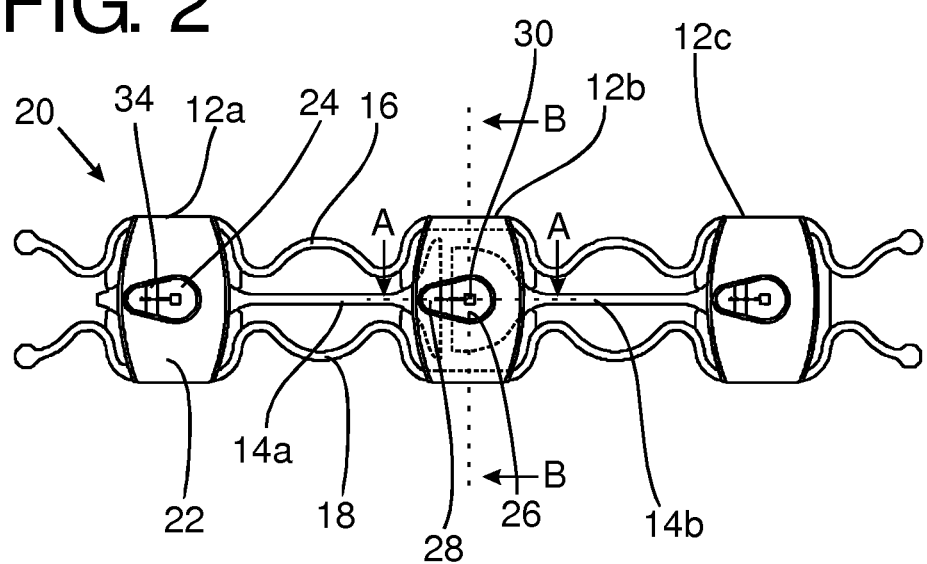
FIG. 2 shows a top view of the lighting device of FIG. 1.

The cutout 24 of each holder 22 exposes portions of two conductor segments separated by a gap 34. The exposed surfaces which will here be referred to as a mounting portion 26 and a contacting portion 28 (FIG. 2).

For the centrally arranged LED 12b, the mounting portion 26 is a portion of a second central conductor segment 14b and the contacting portion 28 is a portion of the first central conductor segment 14a. An unpackaged LED die element (L0) is attached to the mounting portion 26 and electrically connected to the contacting portion 28 by a bond wire 32.

The central conductor segments 14a, 14b with the mounting portion 26 and contacting portion 28 are arranged in between the outer conductor segments d, 18 of the leadframe. In the examples shown, all four conductor segments 14a, 14b, 16, 18 are jointly embedded within the holder 22 of the centrally arranged LED 12b, thereby fixing the separate conductor segments relative to each other. The holder 22 is made of not electrically conductive plastic, such that the conductor segments remain electrically separate.

Within the cutout 26 of the holder 22, the gap 34 is visible between the mounting portion 26 and the contacting portion 28. A bond wire 32 contacted to the top surface of the LED die 30 is arranged over the gap 34. The LED die 30 of the centrally arranged LED 12b is therefore electrically connected between the two central conductor segments 14a, 14b.

The LEDs 12a, 12b, 12c central conductor segments 14a, 14b are arranged in a chain, one following another, interconnected by the conductor segments 14a, 14b, 16, 18. In each of the LEDs, LED dies 30 and bond wires 32 are electrically connected between conductor segments extending to both sides. The LED dies 30 of the LEDs 12a, 12b, 12c are thus electrically connected in series.

Figure 5A:
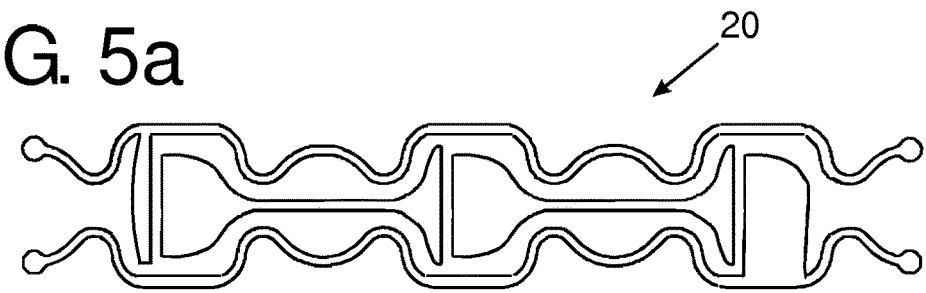
FIG. 5a-5d show steps of a process for manufacturing the lighting device of FIG. 1, 2.
Figure 5B:
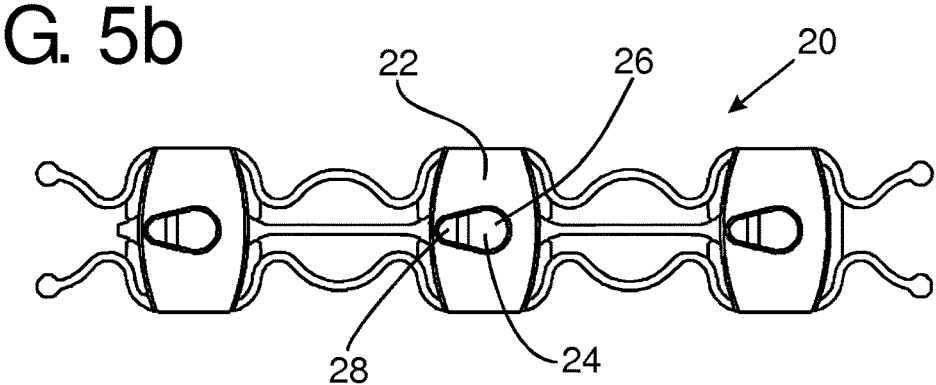
Figure 5C:
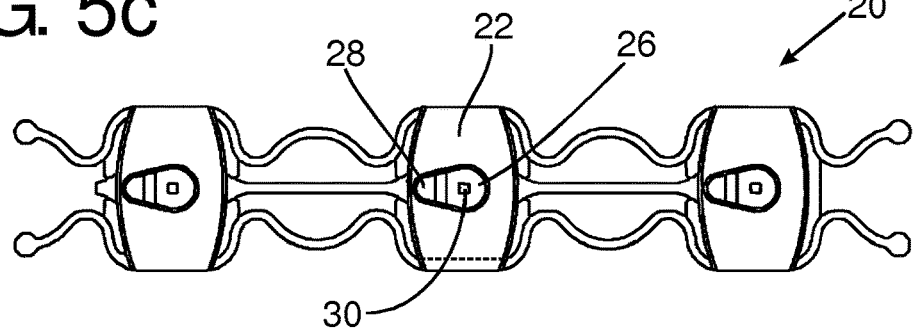
Figure 5D:
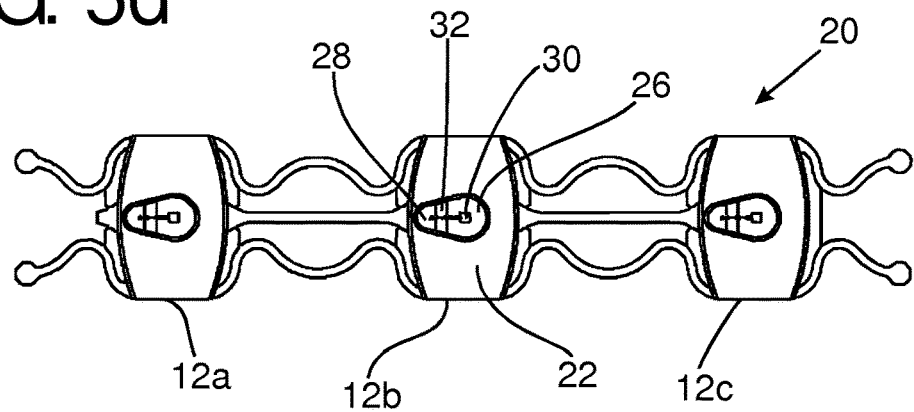

While the three LEDs 12a, 12b, 12c have externally identical shape, the shape of the conductor segments embedded therein differs, as visible from FIG. 5a. In the first LED 12a, the contacting portion 28 is provided as part of the first outer conductor segment 16. The gap 34 is thus formed between the first outer conductor segment 16 and the first central conductor segment 14a. In the second LED 12b, the contacting portion 28 is provided as part of the first central conductor segment 14a, separated by the gap 34 from the second central conductor segment 14a. In the third LED 12c, the contacting portion 28 is provided as part of the second central conductor segment 14b, while the mounting portion 26 is formed on the second outer conductor segment 18. As a result, the three LEDs 12a, 12b, 12c are electrically connected in series between the first and second outer conductor segments 16, 18.

As shown in FIG. 1, the outer conductor segments 16, 18 terminate at both ends in connection pads 36. A plurality of identical lighting devices 10 may be connected together by these connection pads 36 for forming a larger chain of devices. The LED dies 30 are then electrically connected in a series/parallel circuit between the outer conductors segments 16, 18, where multiple series connections of three LEDs are together connected in parallel to common terminals.

Aside from the slightly different shape of the conductor segments, the three LEDs 12a, 12b, 12c are identical. In the following, the arrangement of the LED die 30 and the shape of the holder 22 will be described for the second LED 12b, but the same applies to the other LEDs 12a, 12c.

Figure 3:
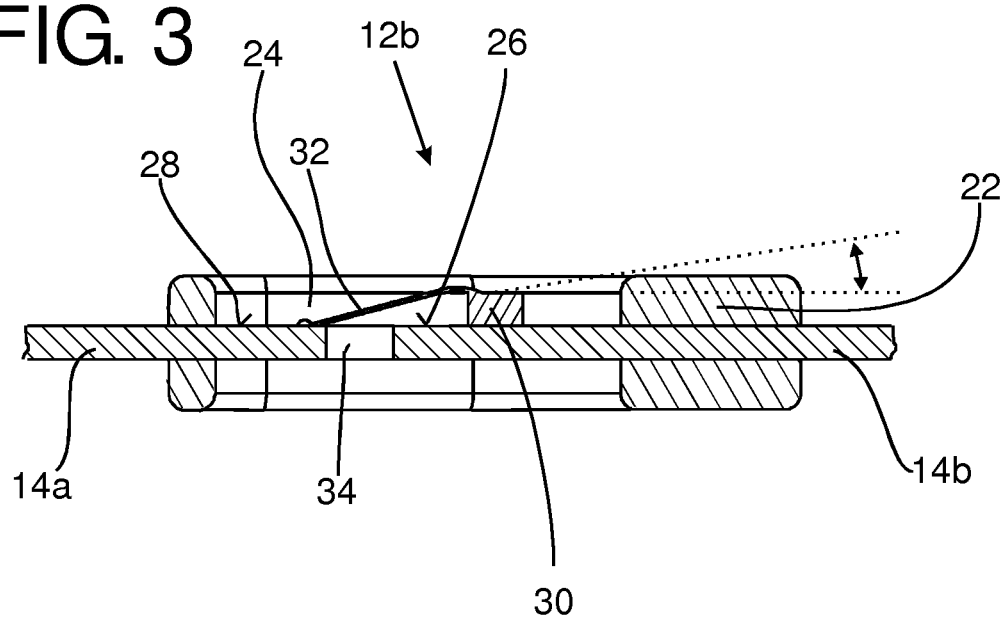
FIG. 3 shows a section along A . . . A in FIG. 2.
Figure 4:
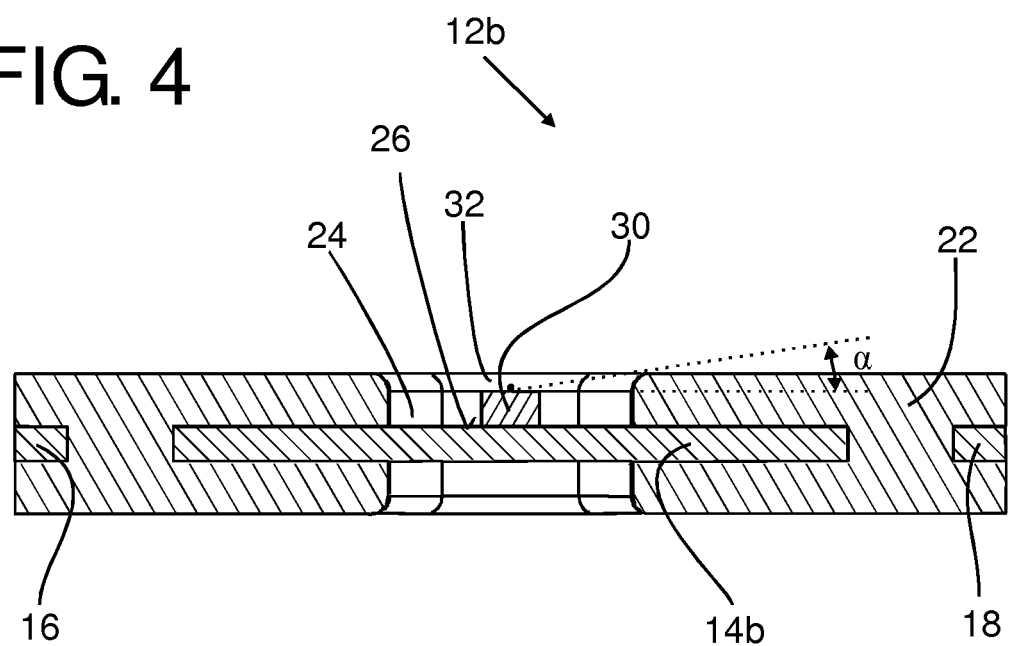
FIG. 4 shows a section along B . . . B in FIG. 2.

As visible from FIG. 2 and from the sectional views of FIG. 3, 4, the holder 22 of the second LED 12b surrounds the LED die 30 in a plane parallel to the mounting portion 26. Due to the drop shaped cutout 24, the holder 22 keeps a certain distance to the LED die 30. Due to this distance and due to the flat shape of the holder 22, light can be freely emitted from the top surface of the LED die 30 in operation thereof. Only light emitted under very small elevation angles α of less than 10° to the mounting surface strikes the holder 22.

The material of the holder 22 is opaque, such that light emitted from the LED die 30 may not be conducted to the bottom side and emitted there as stray light. The holder material is of white color, thus has high reflectivity. Consequently, very little light emitted from the LED die 30 is lost.

As the skilled person will understand, the described embodiment of a lighting device with only three LEDs 12a, 12b, 12c is shown as an example only. In alternative embodiments, a lighting device may include more than three LEDs, e. g. arranged at a regular pitch. For these alternative embodiments, either further LEDs may be added to a continuous leadframe or a plurality of smaller lighting devices with separate leadframes may be connected one after the other, e.g. interconnecting the outer leadframe conductor segments 16, 18 by their connection pads 36.

The described embodiments of lighting devices may be bent to any desired shape. While the central conductor segments 14a, 14b extend straight, the outer conductor segments 16, 18 are provided with loops formed by opposite bends. Thus, the length of the outer conductor segments 16, 18 between the LEDs 12a, 12b, 12c is greater than the length of the central conductor segments 14a, 14b. This allows to bend the device 10, e. g. to follow a desired contour, without causing the freely extending conductor segments to short-circuit.

An example method of manufacturing the lighting devices will be explained in connection with FIG. 5a-5d.

In a first step, the leadframe 20 is formed as shown in FIG. 5a, i. e. with separate conductor segments, e. g. by stamping from a metal sheet or plate.

In a second step, the holders 22 are formed on the leadframe 20, in particular by injection molding. The holders 22 partially embed the conductor segments while their cutouts 24 expose the mounting portions 26 and contacting portions 28.

In the next step, the LED dies 30 are attached to the mounting portions 26 within the cutouts 24. The leadframe 20, stabilized by the holders 22, is stable enough for attaching the LED dies 30.

Finally, the LED dies 30 are electrically connected across the gap 34 by bond wires 32. Again, the leadframe 20 is sufficiently stabilized by the holder 22 such that the mounting portion 26 and contacting portion 28 are fixed relative to each other, thus allowing to attach the bond wire 32.

Figure 6:
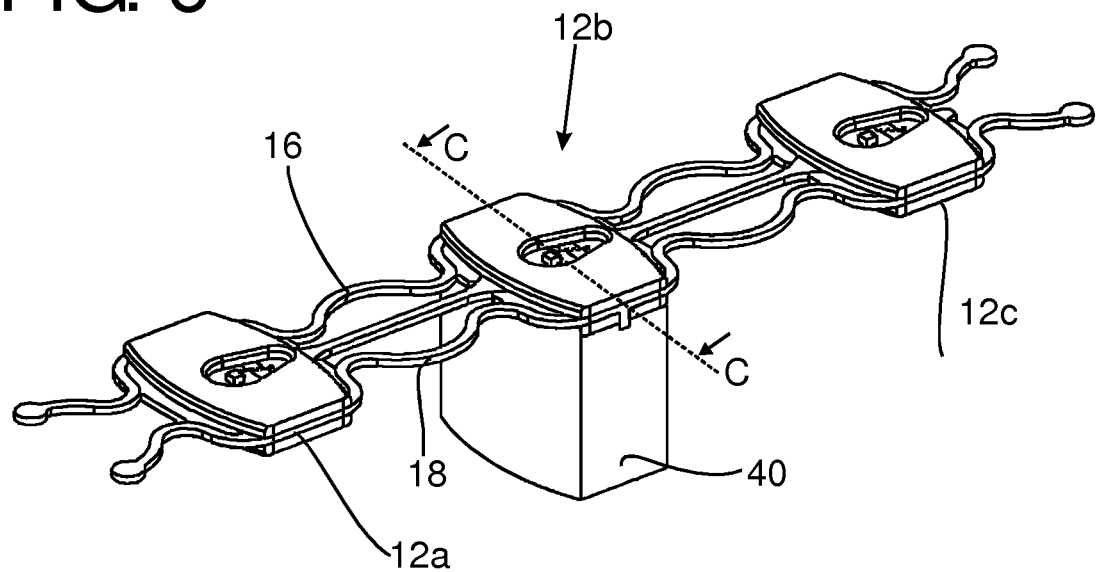
FIG. 6 shows a perspective view of a second embodiment of a lighting device.
Figure 7:
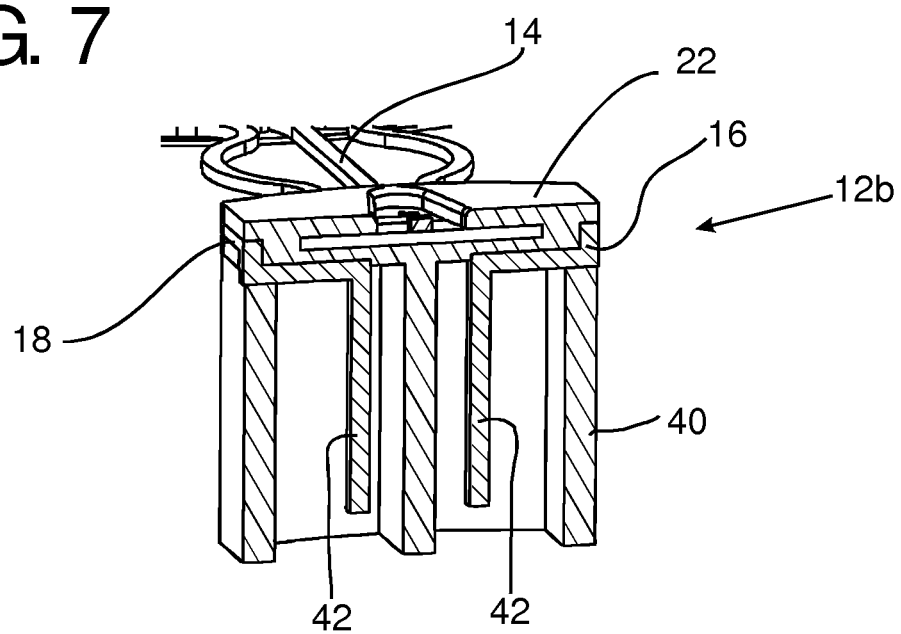
FIG. 7 shows a perspective view of a section along C . . . C in FIG. 5.

FIGS. 6, 7 show an alternative embodiment of a lighting device. Many elements of the alternative embodiment correspond to the above described first embodiment; like parts will be referenced by like numerals. In the following, only differences between the embodiments will be described.

In the alternative embodiment, an electrical and mechanical connector 40 is formed integrally with the LED 12b. As shown in FIG. 6, 7, electrical connector portions 42 are bent from the outer conductor segments 16, 18. A plug housing is formed integrally with the holder 22. The mechanical and electrical connector 40 shown in the alternative embodiment may be use to both hold the lighting device in position and supply electrical operating power thereto.

It should be noted that the above-mentioned embodiments illustrate rather than limit the invention, and that those skilled in the art will be able to design many alternative embodiments without departing from the scope of the appended claims.

For example, the shape, size and number of LEDs provided on the leadframe 20 may vary, as well as the relative arrangement, such as the distance between the LEDs, depending on the desired lighting application. The shape of the leadframe 20 may also differ for alternative embodiments. The leadframe may comprise fewer or more conductor segments.

While in the embodiment according to FIG. 6, 7 an electrical/mechanical connector 40 is formed on the bottom side of the holder 22, it is also possible to provide a mechanical connector, e. g. for an optical element, on the top side thereof.

In the claims, any reference signs shall not be construed as limiting the claim. The word "comprising" or "including" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. A lighting device comprising:
   at least a first LED lighting element, a second LED lighting element and a third LED lighting element arranged at a distance from each other; and
   a leadframe comprising a plurality of conductor segments that include at least a first outer conductor segment, a second outer conductor segment, a first central conductor segment, and a second central conductor segment, the first and second central conductor segments extending straight between two of the first, second and third LED lighting elements, and the first and second outer conductor segments each comprising a bent portion,
   the at least the first, second and third LED lighting elements each comprising an LED die element in a cut out in a holding element, at least two of the plurality of conductor segments of the leadframe being at least partially embedded within the holding element,
   the LED die element of the first LED lighting element being electrically coupled to the first central conductor segment and the first outer conductor segment of the leadframe,
   the LED die element of the third LED lighting element being electrically coupled to the second outer conductor segment and the second central conductor segment of the leadframed, and
   the LED die element of the second LED lighting element being between the first LED lighting element and the third LED lighting element and electrically coupled to the first central conductor segment and the second central conductor segment of the leadframe.

2. The lighting device according to claim 1, wherein:
   each of the LED die elements comprise a top surface configured to emit light, and
   each of the holding elements are arranged to partially surround each of the LED die elements at a distance, not covering each of the LED die elements in a direction perpendicular to the top surface.

3. The lighting device according to claim 1, wherein each of the LED die elements have a bottom electrical terminal in direct contact with mounting portions on at least one of the first or second conductor segments of the leadframe, and a top electrical terminal connected to contacting portions on an oppositing one of the first or second conductor segments of the leadframe by a wire.

4. The lighting device according to claim 3, wherein each of the holding elements are disposed to fix conductor segments including the mounting portions relative to the conductor segments including the contacting portions by partially embedding the conductor segments.

5. The lighting device according to claim 1, wherein the first and second central conductor segments are embedded within the holding element of the second LED lighting element.

6. The lighting device according to claim 1, wherein at least one of the first and second outer conductor segments extending between the first LED lighting element and the second LED lighting element comprises at least one bent portion.

7. The lighting device according to claim 1, wherein a length of the first and second outer conductor segments is larger than a length of the first central conductor segment.

8. The lighting device according to claim 1, wherein:
the first central conductor segment, the first outer conductor segment and the second outer conductor segment extend between the first LED lighting element and the second LED lighting element, and
the first central conductor segment is arranged in between the first outer conductor segment and second outer conductor segment.

9. The lighting device according to claim 1, wherein the holding element of at least one of the first LED lighting element, the second LED lighting element and the third LED lighting element comprises at least one of a mechanical connector element and an electrical connector element.

* * * * *